United States Patent
Marks et al.

(10) Patent No.: US 7,678,463 B2
(45) Date of Patent: Mar. 16, 2010

(54) INTERCALATED SUPERLATTICE COMPOSITIONS AND RELATED METHODS FOR MODULATING DIELECTRIC PROPERTY

(75) Inventors: Tobin J. Marks, Evanston, IL (US); Antonio Facchetti, Chicago, IL (US)

(73) Assignee: Northwestern University, Evanston, IL (US)

( * ) Notice: Subject to any disclaimer, the term of this patent is extended or adjusted under 35 U.S.C. 154(b) by 618 days.

(21) Appl. No.: 11/642,504

(22) Filed: Dec. 20, 2006

(65) Prior Publication Data

US 2007/0181961 A1    Aug. 9, 2007

Related U.S. Application Data

(60) Provisional application No. 60/751,861, filed on Dec. 20, 2005.

(51) Int. Cl.
*B32B 25/20* (2006.01)

(52) U.S. Cl. .................................... 428/447; 528/35
(58) Field of Classification Search ............... 428/447; 528/35
See application file for complete search history.

(56) References Cited

U.S. PATENT DOCUMENTS

| | | | |
|---|---|---|---|
| 4,689,085 A | | 8/1987 | Plueddemann |
| 6,855,274 B1 | | 2/2005 | Marks et al. |
| 2002/0131663 A1 | * | 9/2002 | Marks et al. .................... 385/2 |
| 2005/0064204 A1 | | 3/2005 | Lalli et al. |
| 2005/0271900 A1 | | 12/2005 | Kobrin et al. |

FOREIGN PATENT DOCUMENTS

WO           91/08241      *   6/1991

* cited by examiner

*Primary Examiner*—Kuo-Liang Peng
(74) *Attorney, Agent, or Firm*—Reinhart Boerner Van Deuren s.c.

(57) ABSTRACT

Compositions, methods of using inorganic moieties for dielectric modulation, and related device structures.

10 Claims, 3 Drawing Sheets

INTERCALATED SUPERLATTICE COMPOSITIONS AND RELATED METHODS FOR MODULATING DIELECTRIC PROPERTY

This application claims priority benefit from application Ser. No. 60/751,861 filed Dec. 20, 2005, the entirety of which is incorporated herein by reference.

The United States government has certain rights to this invention pursuant to Grant No. N00014-05-1-0541 from the Office of Naval Research and Grant No. 521-0077-050-A1/NCC2-1363 from the National Aeronautics and Space Administration, both to Northwestern University.

The possibility of using small molecules and polymeric organic materials for applications in the electronic/semiconductor industry has been of great scientific and technological interest for several decades. Among the types of organic materials actively investigated have been conducting polymers for charge transporting (contact/electrodes) applications and as sensors/actuators, semiconductors as active components in field-effect/p-n devices, light emitters, laser emitters, energy conversion devices, sensors, and dielectric materials for capacitors, piezoelectrics, and other electronic devices. While for many years, electronic materials research has been dominated by the impressive performance of inorganics, the attraction of organic/plastic electronics is driven by the possibility of enabling new applications by circumventing some of the limitations of inorganic materials, and more importantly, of achieving overall comparable device performance but at considerably reduced cost.

One of the fundamental electronic devices where all of the aforementioned material classes are simultaneously utilized is the thin-film field effect transistor (TFT), where organic materials efforts began in the 1980s. The TFT can be considered one of the most powerful single elements in semiconductor manufacture, because it is a fundamental component of a large number, and over a wide range, of electronic devices. In the organic materials sphere, integrated circuits (ICs) fabricated from organic TFTs (OTFTs) offer the potential, if certain material-related barriers can be surmounted, of enabling extremely cheap, adequate performance logic circuits with applications as diverse as electronic price tags, postage stamps, RFID tags, and 'smart' cards. Applications with higher added value such as electronic paper and backplane circuitry for active-matrix displays are other areas of current activity.

Much of the attention of the organic TFT community has been focused on the search for high-mobility, stable, and possibly solution-processable semiconductor materials. Indeed significant recent advances have been made in developing both p-type (hole-transporting) as well as, to a lesser degree, n-type (electron-transporting) semiconductors, with several reviews describing these achievements in detail. Among the molecular semiconductors, pentacene, thiophene oligomers, and metallophthalocyanines (p-type) and naphthalene/perylene derivatives, copper perfluorophthalocyanine, and fluoroalkyl-substituted oligothiophenes (n-type) are those exhibiting the best performance. As far as semiconducting polymers are concerned, polythiophenes, polyfluorenes, and polyarylamines (p-type) and poly(benzo-bis-imidazobenzophenanthroline) (n-type) are the most promising materials reported to date. Polymeric materials such as polyethylene, polycarbonate, polyesters, and polyimides have been used as substrates to impart device mechanical flexibility. Solution-processable electrodes can also be realized from organic-based conductors such as PEDOT:PSS, polyaniline (PANI), various polypyrroles, as well as graphite-based and Ag/Cu-epoxy inks. Most of the semiconductor properties in OTFT devices have been characterized using thermally grown $SiO_2$ on doped Si substrates as the dielectric (insulator). The reason for this choice is the ready availability of this substrate and the fact the $SiO_2$ performs outstandingly as an insulator in many electronic devices, including inorganic TFTs.

However, the art continues the search for alternative insulator materials, in particular, gate insulator and passive materials for OTFTs. Requirements for an OTFT gate insulator material are rather stringent, with most applicable to inorganic transistor gate insulators as well. Crucial parameters include the maximum possible electric displacement $D_{max}$ the gate insulator can sustain, where $D_{max}=\epsilon_0 kE_B$, k is the dielectric constant, and $E_B$ is the dielectric breakdown field; and the capacitance per area, $C_i=\epsilon_0(k/d)$, where d is the insulator thickness. Capacitance magnitude is governed not only by the k value but also by the thickness (d) for which a pinhole-free film can be achieved, and thus may reflect the deposition procedure as well as intrinsic material properties.

A major motivation for $SiO_2$ alternatives is significant reduction in OTFT operating voltage. While carrier mobilities of organic semiconductors have now approached/surpassed those of amorphous Si, this has generally been achieved only at very large source-drain/source-gate biases, typically greater than 30-50 V. OTFT operation at such large biases will incur prohibitively excessive power consumption. Further, in such devices, the semiconductor carrier mobility is gate bias dependent and increases when the gate voltage is increased. A second motivation is that OTFT gate insulators must fulfill demands specific to organic electronics, which include low-cost/low-capital investment manufacture of organic electronic circuits, mainly via solution-processed device assembly. Notwithstanding such concerns, the art remains somewhat lacking and the search continues for viable alternatives to $SiO_2$ insulator materials.

SUMMARY OF THE INVENTION

In light of the foregoing, it is an object of the present invention to provide various dielectric compositions, systems, device structures and/or methods for their use, thereby overcoming various deficiencies and shortcomings of the prior art, including those outlined above. It will be understood by those skilled in the art that one or more aspects of this invention can meet certain objectives, while one or more other aspects can meet certain other objectives. Each objective may not apply equally, in all its respects, to every aspect of this invention. As such, the following objects can be viewed in the alternative with respect to any one aspect of this invention.

It can be an object of the present invention to provide an organic insulator material to reduce operating voltage in TFT and related device structures. In conjunction therewith, it can be another object of the present invention to provide such a material composition which increases the drain current of such a device while operating at low biases. Relating to one or more of the preceding objectives, it can also be an object of this invention to achieve such results by increasing the capacitance of a gate dielectric material.

It can be another object of the present invention to provide an organic gate insulator composition compatible with a wide range of substrate materials, including flexible substrates, and processable/printable from solution or using wet chemical techniques.

Related thereto, it can be another object of this invention to provide such insulator materials insoluble in or stable to solvents used in the fabrication of organic semiconductors, in particular with regard to bottom-gate structures. Likewise, it can be an object of this invention to provide organic insulator compositions compatible with gateline deposition techniques, with regard to top-gate structural configurations.

Other objects, features, benefits and advantages will be apparent from this summary and the following descriptions of certain embodiments, and will be readily apparent to those skilled in the art having knowledge of various dielectric materials, TFT and related device structures, and associated assembly/production techniques. Other objects, features, benefits and advantages will be apparent from the above as taken into conjunction with the accompanying examples, data, figures and all reasonable inferences to be drawn therefrom, alone or with consideration of the references incorporated herein.

In part, the present invention can be directed to a dielectric composition. The dielectric composition generally has a multi-layered structure. Specifically, the structure of the dielectric composition can be described as a superlattice having periodically alternating layers of different materials. These alternating layers can include one or more layers that include a silyl or siloxane moiety ("an organic layer"), one or more layers that include a π-polarizable moiety ("a chromophore layer"), and one or more layers that include an inorganic moiety ("an inorganic layer"). At least some of the alternating layers can be coupled by a coupling or capping layer that includes a siloxane matrix. Alternatively, the dielectric composition can be described as having an assembled organic component having alternating organic layers and chromophore layers, among which one or more inorganic layers are intercalated. The inorganic layers can include one or more main group metals and/or transition metals. In some embodiments, the metal(s) can be selected from a Group 3 metal, a Group 4 metal, a Group 5 metal, and a Group 13 metal. In particular embodiments, the main group metal(s) can be selected from a Group 13 metal such as, but not limited to, gallium (Ga), indium (In), and thallium (Tl) etc., and the transition metal can be selected from a Group 3 metal such as, but not limited to, ittrium (Y), a Group 4 metal such as, but not limited to, titanium (Ti), zirconium (Zr), and hafnium (Hf), and a Group 5 metal, such as but not limited to, tantalum (Ta).

Such dielectric compositions would be understood by those in the art made aware of this invention, can be selected from available materials, of the sort provided herein, providing favorable capacitance properties. The metal components and/or precursors thereto can comprise the metals described above in the form of oxides, alkoxides, halides and the like, as would be understood by those skilled in the art made aware of this invention. From a structural-functional perspective, described more fully below, such dielectric compositions can comprise an intercalated metal/metal oxide component providing and/or contributing to higher dielectric constant (k) values and improved capacitance capabilities.

Regardless, a dielectric composition of this invention can comprise at least one organic component comprising π-polarizable moieties that are covalently bonded to or crosslinked with a siloxane bond sequence. In certain embodiments, such a dielectric composition can optionally comprise a hydrocarbon or fluorocarbon moiety coupled with silicon-oxygen bonds to such an organic component. In certain other embodiments, such a dielectric composition can comprise at least one siloxane moiety or component coupled to such an organic component, with silicon-oxygen bonds. Regarding such embodiments, a siloxane moiety can be positioned between an organic component and a hydrocarbon moiety, coupled to each with silicon-oxygen bonds. Such components are described more fully in co-pending application Ser. No. 11/181,132, filed Jul. 14, 2005, the entirety of which is incorporated herein by reference.

Such a silicon-oxygen bonding sequence can be the condensation product of a hydrolyzable silicon moiety (e.g., without limitation, a halogenated, alkoxylated, amino, and/or carboxylated silyl moiety) and a hydroxyl functionality. As understood in the art and explained more fully in one or more of the references incorporated herein, such a bonding sequence can derive from use of starting material compounds for the respective dielectric components or moieties, such compounds substituted with one or more hydrolyzable silicon moieties, hydrolysis of such a moiety under self-assembly conditions, and condensation with a subsequent layer starting material or precursor compound.

Regardless, in certain embodiments, an organic component of such a dielectric composition can include one or more chromophore layers, i.e., one or more layers that include a π-polarizable moiety. The π-polarizable moiety can include conjugated π-electrons. In some embodiments, the π-polarizable moiety can include one having at least one of a dipole moment, an electron releasing moiety, an electron withdrawing moiety, a combination of such moieties, a zwitterion and a net charge. Without limitation, such a component can comprise a non-linear optical (NLO) chromophore. In some embodiments, the chromophore can include a π-conjugated system, which can include a system of atoms covalently bonded with alternating single and multiple (e.g., double) bonds (e.g., C=C—C=C and C=C—N=N—C). The π-conjugated system can include heteroatoms such as, but not limited to, nitrogen (N), oxygen (O), and sulfur (S). In some embodiments, the π-conjugated system can include one or more aromatic rings (aryl or heteroaryl) linked by conjugated hydrocarbon chains. In certain embodiments, the aromatic rings can be linked by conjugated chains that include heteroatoms (e.g., azo groups [—N=N—]). For example, the π-polarizable moiety can be a chromophore that includes a stilbazolium moiety. The identity of such compounds are limited only by their electronic/structural features and resulting polarizability in the context of a particular use or application, as illustrated by various representative embodiments described herein.

The organic component of such a dielectric composition can also include one or more organic layers, i.e., one or more layers that include a silyl or siloxane moiety. In certain non-limiting embodiments, the organic layers can include a bis (silylated) alkyl moiety (e.g., ranging from about $C_1$ to about $C_{20}$). In particular embodiments, the organic layers can be coupled to the chromophore layers directly or via a coupling or capping layer that includes a siloxane matrix. The coupling can be performed via a condensation reaction or chemisorption using known silicon chemistry. For example, precursors of the silyl moiety and the siloxane moiety can include hydrolyzable groups such as, but not limited to, halo groups, alkoxy groups, and amino groups. Examples of such precursors can include, but are not limited to, $Cl_3Si(CH_2)_nSiCl_3$, $(CH_3O)_3Si(CH_2)_nSi(OCH_3)_3$, and $(Me_2N)_3Si(CH_2)_nSi(NMe_2)_3$, where n can be an integer in the range of 1-10 (i.e., n can be 1, 2, 3, 4, 5, 6, 7, 8, 9, or 10). As discussed more fully herein, such groups are hydrolyzable to a degree sufficient for substrate sorption or condensation or intermolecular crosslinking via siloxane bond formation under the processing or fabrication conditions employed. Similarly, the π-polarizable moiety can be derivatized to include similar silyl hydrolyzable groups, to allow bond formation with the siloxane capping layer and/or the organic layer. In particular embodiments, the organic layers and the chromophore layers can be individually self-assembled monolayers that include the silyl or siloxane moiety, or the π-polarizable moiety.

Precursor compounds incorporated into such compositions include, for instance, bis-trichlorosilyloctane, octachlorotrisiloxane and 4-[[(4-(N,N-bis((hydroxy)ethyl)amino]-phenyl]azo]-1-(4-trichlorosilyl)benzyl-pyridinium iodid—which, when condensed one with another, provide a corresponding layered dielectric assembly, in accordance with this invention.

While several of the aforementioned dielectric compositions, components, compounds, layers and moieties are illustrated in the aforementioned incorporated reference, various other component compounds and associated moieties are contemplated within the scope of this invention, as would be understood by those skilled in the art made aware thereof. For instance, without limitation, various other π-polarizable components and associated moieties are described in U.S. Pat. No. 6,855,274, in particular the NLO structures of FIGS. 1-2, 11, 13 and 15 thereof, U.S. Pat. No. 6,549,685, in particular FIGS. 2-3 thereof, and U.S. Pat. No. 5,156,918, in particular the structures of FIGS. 4-5 thereof, each with reference to the corresponding specification regarding alternate embodiments synthesis and characterization, each of which is incorporated herein by reference in its entirety. Further, as would be understood by those skilled in the art, various other non-linear optical chromophore components are described in "Supramolecular Approaches to Second-Order Nonlinear Optical Materials. Self-Assembly and Microstructural Characterization of Intrinsically Acentric [(Aminophenyl)azo]pyridinium Superlattices", Journal of American Chemical Society, 1996, 118, 8034-8042, which is hereby incorporated by reference in its entirety. Such components can be used, as described herein, with a variety of difunctionalized hydrocarbon and/or siloxane moieties or components, without limitation as to hydrocarbon length or degree of functionalization capable of condensation with a suitable substrate and/or various other dielectric components in accordance with this invention.

A component-by-component, layer-by-layer modularity can provide for incorporation or intercalation of other structural and/or functional (e.g., optical, magnetic, mechanical) components or constituents during assembly. In accordance therewith and as described below, the dielectric and/or capacitance properties of a self-assembled organic component can be increased beyond what is possible for such organic materials of the prior art, thereby enabling simplified device design and performance enhancement. Accordingly, the present invention can also be directed to incorporation or intercalation of a metal/metal oxide component imparting or contributing a high k value to the resulting dielectric composition. In certain embodiments, and as described elsewhere herein, such incorporation can be achieved by depositing such a component or precursor thereto on an aforementioned siloxane moiety. However, as would be understood by those skilled in the art made aware of this invention, such components could be otherwise intercalated, substantially without adverse impact on the dielectric properties of such structures.

Regardless, in certain embodiments, an inorganic component/layer can be intercalated within the organic component described herein. In particular embodiments, the dielectric composition can include one or more inorganic layers periodically alternating with the organic layers and chromophore layers described herein. The inorganic layer can include one or more main group metals and/or transition metals, for example, one or more Group 3 metals, Group 4 metals, Group 5 metals, and/or Group 13 metals, and/or a synthetic precursor thereof, to increase the k value of the dielectric composition. Embodiments of the invention that include such intercalated inorganic layers can provide a higher k value when compared to embodiments which only include the organic component. Such inorganic layers can include, but are not limited to, $Ga^{+3}$ $In^{+3}$, $Ti^{+4}$, $Zr^{+4}$, and/or $Hf^{+4}$ species, such as those provided through use of the corresponding halides or alkoxides. However, various other high k value precursors, whether synthetically or commercially-available, can be used with comparable effect. Such components and their precursors can include those described in co-pending application Ser. No. 10/254,335 filed Sep. 25, 2002, the entirety of which is incorporated herein by reference. As discussed more fully below, such intercalated components are not fully characterized, but are likely to be the reaction and/or sorption product (e.g., chemisorption product) of the corresponding precursor and a hydrophilic or siloxane capping component. In certain such embodiments, such a capping layer can comprise a siloxane moiety. Octachlorotrisiloxane is an especially preferred siloxane capping agent, but other molecular components can be used comparably to provide the desired functional effect. Regardless, such intercalation is confirmed, with resulting performance properties demonstrated, as shown in several of the following examples.

For instance, a metal of such a component can be, without limitation, Ga, In, Y, Ti, Zr, Hf, or Ta, a precursor to which can be the corresponding alkoxide. However, as discussed herein, various other high k value precursor compounds can, alternatively, be utilized so as to provide one or more enhanced performance properties of the sort described herein. In accordance therewith, various main group or transition metal compounds imparting a high k factor to the resulting composition can be utilized, such compounds including but not limited to those of Group 3, Group 4, Group 5, Group 13, and Group 14.

Accordingly, the present invention can also comprise a method of using such a metal component to control and/or enhance dielectric-related properties of an organic dielectric component. Such a method can comprise preparing a layered asymmetric and/or polarizable organic material having at least one chromophore component; and intercalating a Group III metal, Group IV metal or other transition metal component therein. Metal components can be intercalated as demonstrated in several of the following examples and detailed descriptions. Such metal components can be the reaction/sorption product of a suitable precursor with a hydrophilic component of the material. Intercalation of such an inorganic component that can impart a high or higher k factor is shown to affect dielectric properties of the composition. Iterative intercalation and/or metal choice can be further used to control, tune and/or enhance capacitance, as well as other related physical or performance properties.

In part, the present invention can also be directed to a range of composites comprising such dielectric compositions and related device structures. As can relate to such compositions, composites and devices, and their fabrication, suitable substrates include those having a hydroxylated surface portion or as can be treated to provide a hydroxyl functionality. Such substrates include but are not limited to silicon, silicon dioxide, zinc oxide, indium oxide, as can include tin and/or other dopants, and other such materials recognized by those in the art.

As demonstrated below, intercalation of one or more metal oxide layers, employing one or more of a variety of metal oxides, into self-assembled superlattices (SASs) can efficiently modulate the dielectric properties of a SAS dielectric, and the resulting films can be easily integrated into OTFT devices. The results support application of this invention not only in OFET technologies but also as capacitive elements in LC displays, supercapacitors, and other insulated field-effect devices.

One aspect of the invention therefore is directed to a thin film transistor device that includes a substrate(including a substrate-gate material such as, but not limited to, doped-silicon wafer, tin-doped indium oxide on glass, tin-doped indium oxide on mylar film, and aluminum on polyethylene terephthalate), a dielectric material as described herein deposited on the substrate/substrate-gate, a semiconductor material deposited on the dielectric material, and source-drain contacts. Particularly, the dielectric composition described herein can be transparent and can be integrated into a transparent TFT device which includes a transparent or substantially transparent substrate and a transparent or substantially transparent semiconductor material. As used herein, "transparent" refers to having at least a 90% transmittance in the visible region of the spectrum, and "substantially transparent" refers to having at least 80% transmittance in the visible region of the spectrum. For example, the substrate can be glass or other transparent material, and the semiconductor material can be, for example, a transparent organic or inorganic material such as, but not limited to, a transparent conducting oxide. In certain embodiments, the contacts/electrodes of such device can be transparent as well.

DETAILED DESCRIPTION OF CERTAIN EMBODIMENTS

Throughout the description, where compositions are described as having, including, or comprising specific components, or where processes are described as having, including, or comprising specific process steps, it is contemplated that the compositions also consist essentially of, or consist of, the recited components, and that the processes also consist essentially of, or consist of, the recited processing steps.

In the application, where an element or component is said to be included in and/or selected from a list of recited elements or components, it should be understood that the element or component can be any one of the recited elements or components and can be selected from a group consisting of two or more of the recited elements or components.

The use of the singular herein includes the plural (and vice versa) unless specifically stated otherwise. In addition, where the use of the term "about" is before a quantitative value, the invention also includes the specific quantitative value itself, unless specifically stated otherwise.

It should be understood that the order of steps or order for performing certain actions is immaterial so long as the method remains operable. Moreover, two or more steps or actions can be conducted simultaneously.

Figure 1:
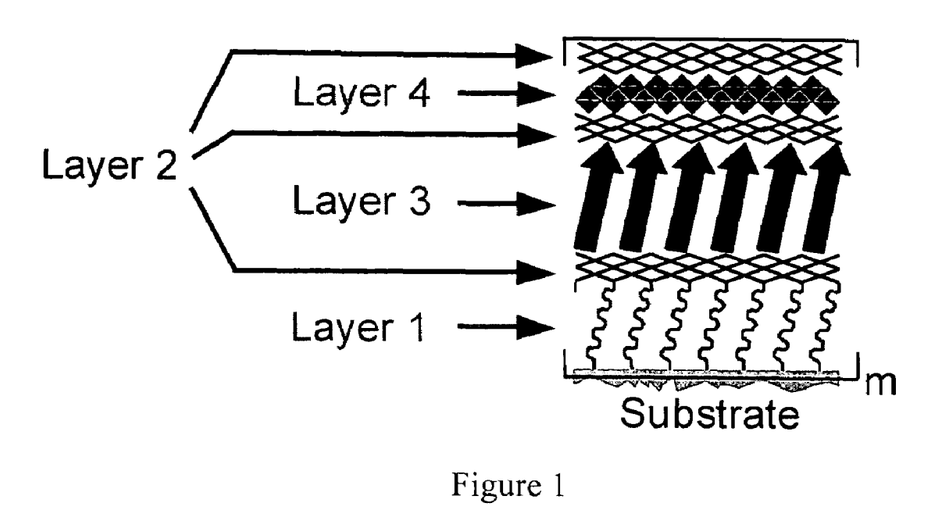
FIG. 1. General structure schematically illustrating various representative SAS high-k dielectric configurations, where $m \geq 1$. In accordance with this invention, alternate layer orders/combinations (e.g., 2-3-2-4, etc.) are available using synthetic methodologies of the sort described herein.

With reference to FIG. 1, as illustrated herein and through one or more incorporated references, compositions of this invention can be prepared using known silicon chemistry. Syntheses can include providing an organic polarizable material having a silyl-derivatized chromophore; desilylating the chromophore to generate terminal hydroxy functionalities, and reacting the hydroxy functionalities with a reagent having at least one silicon moiety. In certain embodiments, the chromophore is a high-β chromophore and/or is derivatized with a trialkylsilyl protecting group. Such protecting groups useful with the present invention are limited only by the availability of the corresponding silane precursor compound and/or the effectiveness of the resulting protecting group in the self-assembly procedures described herein. Effectiveness is, in part, based on the deprotection of the hydroxy functionality and removal of the protecting group. Various deprotecting agents are available and would be well known to those skilled in the art of silyl chemistry and its integration into the present invention. Preferably, fluoride reagents can be used with good effect, in particular quaternary ammonium fluoride reagents. Various protecting groups and reagents along with corresponding deprotection schemes would be well-known to those skilled in the art and aware of this invention. See, T. W. Greene and P. G. M. Wuts, "Protective Groups in Organic Synthesis", 1999, 3rd ed., John Wiley & Sons, Inc., New York.

With reference to the preceding, the trialkylsiloxy moieties correspond to the aforementioned silyl protecting groups and are derived from the appropriate silane reagents upon reaction with the chromophore material. Desilylation can be achieved as discussed elsewhere, with the resultant terminal hydroxy groups reactive with a reagent having at least one silicon moiety. In preferred embodiments, such a reagent is a siloxane. Octachlorotrisiloxane is an especially preferred siloxane capping agent, but other molecular components can be used with similar effect. Such components include, without limitation, the bifunctional silicon compounds described in U.S. Pat. No. 5,156,918, at column 7 and elsewhere therein, incorporated by reference herein in its entirety. Other useful components, in accordance with this invention include those compounds which cross-link upon curing. Reaction between the terminal hydroxy groups and the capping agent provides a siloxane bond sequence between the chromophore film/layer and capping layer. Deprotection of a chromophore followed by coupling with a capping agent provides a siloxane bonded bilayer. Sequential repetition of this synthetic sequence, with metal intercalation of the sort described above, can be used as a method for assembling a multi-layered dielectric material.

Chromophores useful in conjunction with this invention can include a π-conjugated system, which can include a system of atoms covalently bonded with alternating single and multiple (e.g. double) bonds (e.g., C=C—C=C—C and C=C—N=N—C). The π-conjugated system can include heteroatoms such as, but not limited to, nitrogen (N), oxygen (O), and sulfur (S). In some embodiments, the π-conjugated system can include one or more aromatic rings linked by conjugated hydrocarbon chains. In some embodiments, the chromophore can have a structural formula $(Ch)QR_p$, wherein $(Ch)Q$ is a chromophore substructure and Q is a heteroatom, R is a trialkylsiloxyalkyl moiety and p is the number of moieties meeting the valence requirement of the corresponding heteroatom. Preferably, the heteroatom is oxygen, nitrogen, or sulfur, but can be any electron-rich heteroatom. Likewise, in preferred embodiments, the chromophore compositions of this invention include and can be represented by any of the structural formulas provided herein or in one of the aforementioned incorporated references. (See, in particular, the formulas of FIGS. 1, 2, 11 and 15 of co-pending application Ser. No. 10/254,335.) With respect to the latter, such substructures can be modified as described herein to provide suitable chromophore components. Furthermore, the silyl chemistry used in conjunction with this invention can be applied to other chromophore systems (e.g., FIG. 1 thereof) known in the art, such systems synthetically modified as necessary by well-known procedures to take advantage of the self-assembly strategies described herein. For example, various other systems known in the art are described in U.S. Pat. Nos. 5,156,918, 5,834,100 and 6,033,774, each of which is incorporated herein by reference in its entirety, but especially with regard to each respective discussion of the corresponding chromophore and/or conductive molecular components.

More specifically, the compositions of this invention can provide a facile, efficient all-"wet-chemical" synthetic approach and/or method relating to enhancement, control and/or tuning of dielectric properties by intercalating metal oxide sheets. Such methods can include, iterratively, in preferred embodiments: providing and/or chemisorption of a protected chromophore; removal of the protecting groups to generate a large density of reactive hydroxyl sites; capping (e.g., chemisorption, exposure to ambient, thermal cure) of each "deprotected" chromophore layer with a poly-siloxane, such as but not limited to $Si_3O_2Cl_8$; deposition (e.g., chemisorption, exposure to ambient, thermal cure) of one or more sheets from TUF or otherwise suitable solutions of a main group and/or transition metal, e.g., a, Group 4, Group 5, and/or Group 13 metal component such as but not limited to $Hf(i-O_3H_7)_4$, $Ga(i-OC_3H_7)_3$, $In(i-OC_3H_7)_3$, $Zr(i-OC_3H_7)_4$, $Ti(i-OC_3H_7)_4$, and $Ta(i-OC_3H_7)_5$; and capping (chemisorption, exposure to ambient, thermal cure) of the oxy-group surface with a polysiloxane.

However, the chemisorption of, for instance, gallium, indium, and zirconium alkoxides or related main group or transition metal precursors on a hydrophilic surface has not fully been characterized. While formation of oligomers is often observed, for example, upon reaction of gallium or indium alkoxides with protic reagents in solution, this invention is not limited to any one theory or mode of operation. The reaction of the such precursors with a hydrophilic surface (and perhaps adventitious adsorbed $H_2O$) can be considered to provide a corresponding metalloxane and/or oligomeric oxide/alkoxide sorption product, with or without solvent coordination. In any event, the thermally and photochemically robust hybrid thin films resulting therefrom adhere strongly to the glass, silicon, or indium tin oxide-coated glass (ITO-glass) substrates, and are insoluble in common organic solvents.

To illustrate various aspects of this invention, the dielectric/insulating properties of film compositions having the general structure reported in FIG. 1 were investigated by impedance spectroscopy and quantitative leakage current-voltage measurements in MIS (metal-insulator-semiconductor) devices. Furthermore, such dielectrics can be integrated into organic thin-film transistors (OTFTs), a field-effect electronic device.

With reference to FIG. 1, in certain embodiments, m can range from 1 to about 1000; Layer 1 can be absent or can comprise bis(silylated) alkyl $[(CH_2)_n]$ or haloalkyl, e.g., $[(CHF)_n]$ and $[(CF_2)_n]$ chain components derived from, e.g., $X_3Si(CH_2)_nSiX_3$, $X_3Si(CHF)_nSiX_3$, and $X_3Si(CF_2)_nSiX_3$ reagents, respectively, where at least one X can independently be a hydrolyzable moiety selected from but not limited to Cl, OAc, $OC_nH_{2n+1}$ and the like; Layer 2 can comprise a siloxane matrix/network component derived, e.g., from a silane precursor of formula $Si_3O_2X_8$ or $Si_2OX_6$, where at least one X can independently be a hydrolyzable moiety selected from but not limited to Cl, OAc, $N(C_nH_{2n+1})_2$, $OC_nH_{2n+1}$ and the like; Layer 3 can comprise a π-polarizable component derived from a chromophore precursor of the sort described and referenced herein; and Layer 4 can be absent or can comprise a high-k oxide component derived, e.g., from $MY_n$ where $ML_n$ is a main group or transition metal, e.g., a Group 4, Group 5 or a Group 13 metal such as but not limited to Ga, In, Ti, Zr, Hf, and Ta, and L can be a counterion selected from but not limited to Cl and $OC_nH_{2n+1}$.

Figure 2:
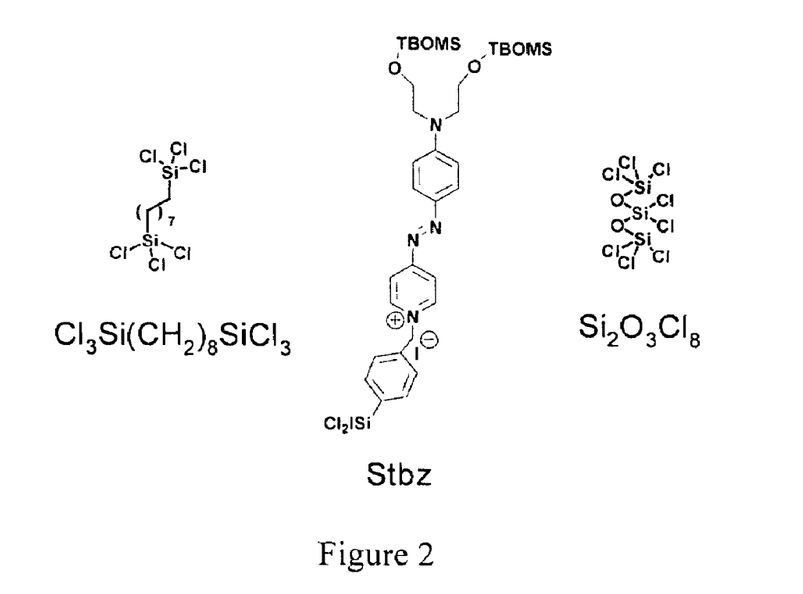
FIG. 2. Chemical structures of the representative, non-limiting SAS dielectric precursors.

Four representative, nonlimiting dielectric films were fabricated (SAS-0, SAS-Ti, SAS-Zr, and SAS-Hf, where SAS denotes a self-assembled superlattice organic component of the sort described one or more of the preceding references, and 0 denotes the absence of a metal/metal oxide component), following the general procedure described in example 2, below, and using the layer precursors reported in Table 1. The structures of the precursors in Table 1 are is shown in FIG. 2. Film thicknesses determined via x-ray reflectivity measurements are ~6.2 nm for SAS-0 and ~8.2-9.5 nm for the other films.

TABLE 1

Precursors for the fabrication of SAS dielectric materials.

| Dielectric structure | m | Precursor of | | | |
|---|---|---|---|---|---|
| | | Layer 1 | Layer 2 | Layer 3 | Layer 4 |
| SAS-0 (I) | 1 | $Cl_3Si(CH_2)_8SiCl_3$ | $Si_3O_2Cl_8$ | Stbz | none |
| SAS-Ti (II) | 1 | $Cl_3Si(CH_2)_8SiCl_3$ | $Si_3O_2Cl_8$ | Stbz | $Ti(n-OC_3H_7)_4$ |
| SAS-Zr (III) | 1 | $Cl_3Si(CH_2)_8SiCl_3$ | $Si_3O_2Cl_8$ | Stbz | $Zr(n-OC_3H_7)_4$ |
| SAS-Hf (IV) | 1 | $Cl_3Si(CH_2)_8SiCl_3$ | $Si_3O_2Cl_8$ | Stbz | $Hf(i-OC_3H_7)_4 \cdot n(i-C_3H_7OH)$ |

Figure 3A:
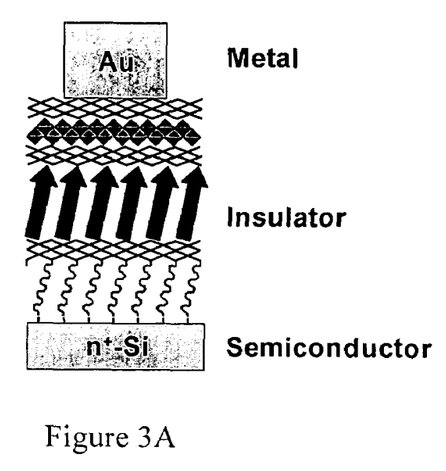
FIGS. 3A-B. Structure of: (A) a representative MIS devices where: the semiconductor can be but is but not limited to $n^+$-Si; the insulator is an SAS-based film of this invention; the metal is, but is not limited to Au. (B) Schematic, non-limiting OFET device where: the gate contact can be but is not limited to $n^+$-Si; the insulator is a SAS-based film of this invention; the organic semiconductor is but not limited to pentacene; the source/drain contacts are, but are not limited to Au.
Figure 3B:
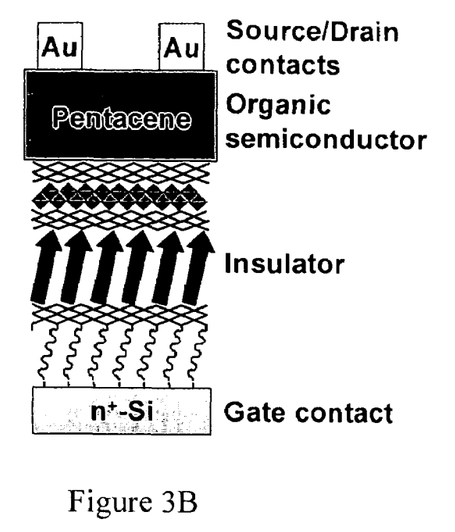

MIS and OFET devices were fabricated with the film components deposited on $n^+$-Si substrates functioning as bottom contact and bottom gate electrodes, respectively. The device structures are schematically shown in FIG. 3. Other FET device structures, including, but not limited to, top-gate top-contacts structures, top-gate bottom-contacts structures, and bottom-gate top-contacts structures, can be fabricated similarly according to the teachings herein.

Figure 4:
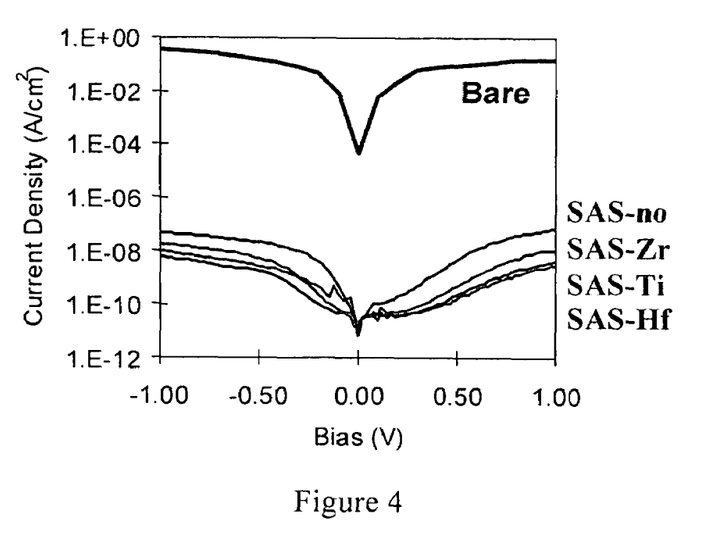
FIG. 4. With reference to Table 1, current density versus voltage plots for $n^+$-Si-native oxide (bare line)-Au and SAS films in the same device structure.

Quantitative solid-state leakage current-voltage measurements through the films in a MIS device demonstrate the excellent dielectric properties of these materials (FIG. 4). While Si/SiO$_2$ native oxide substrates exhibit very large current densities of ~0.1-1.0 A/cm$^2$ at 1.0 V, thin SAS films reduce leakage currents by ~9 orders of magnitude (~10$^{-9}$ A/cm$^2$). Furthermore, intercalation of high-k oxides additionally reduces the leakage current—possibly at least in part due to the increased film thickness. The measured breakdown fields for I-III (>5-8 MVcm$^{-1}$) rival or exceed those reported for far thicker (~50 nm) metal oxide and polymer dielectrics.

Figure 5:
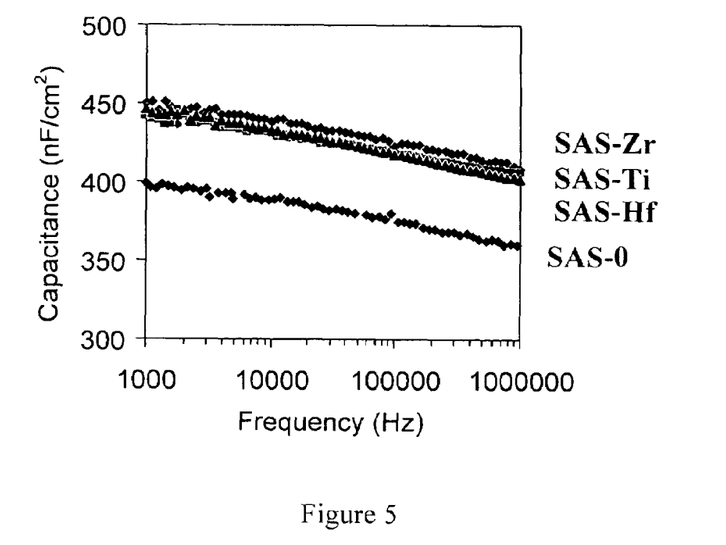
FIG. 5. Capacitance-frequency characteristics of $n^+$-Si-SAS/Au MIS devices.

Capacitance-voltage (C-V) measurements were carried out on MIS structures at 10$^3$-10$^6$ Hz (FIG. 5) and reveal maximum capacitances $C_i$=450 (SAS-Zr); 445 (SAS-Hf); 440 (SAS-Ti) nFcm$^{-2}$ (±5%) at 10$^3$ Hz, with a slight decrease at higher frequencies. The capacitance of the SAS film without high-k oxide layer (SAS-0) is about 380-390 nfcm$^{-2}$ at 10$^3$ Hz. SAS-M films are thicker than SAS-0, and the results demonstrate that such a factor may have a role in the use of high-k layer intercalation to increase capacitance and average film dielectric constant.

Figure 6A:
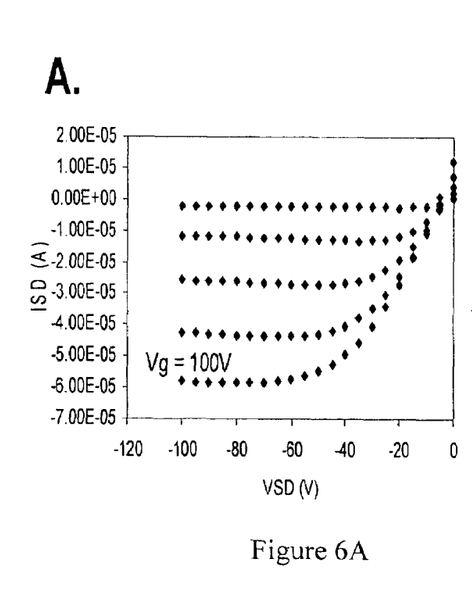
FIGS. 6A-B. TFT output characteristics for pentacene as a function of $V_G$ using (A) Conventional 300 nm-thick $SiO_2$ and (B) SAS-Ti dielectric grown on $n^+$-Si.
Figure 6B:
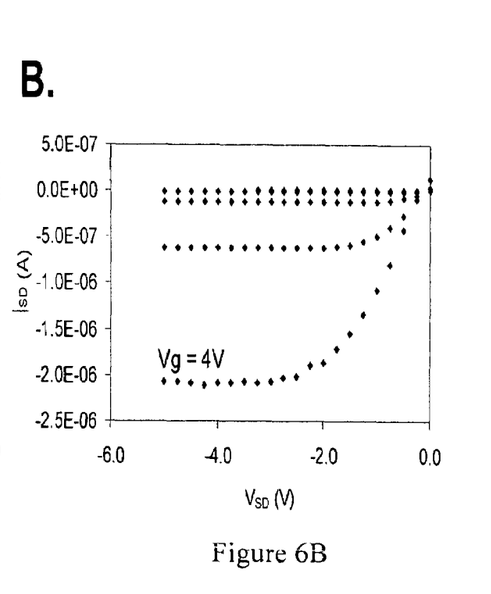

Likewise, in accordance with other aspects of this invention, SAS-based dielectrics also enable low-voltage OTFT devices. The reduction of the operational voltage is possible since the high-capacitance, high-k insulator is able to achieve a comparable TFT channel charge density per unit area ($Q = C_i \times V$) at much lower gate voltage, as compared to the prior art. FIG. 6 shows the output plot of a SAS-Ti-based pentacene TFT. It can be seen that compared to a pentacene TFT with a conventional 300 nm-thick SiO$_2$ insulator ($C_i$=10 nF/cm$^2$), the SAS-based FET exhibits comparable carrier mobility (about 0.1 cm$^2$/Vs) but with about two orders of magnitude reduction in operational voltage. As known in the art, low voltage operation can be used to reduce OFET device power dissipation and enable high frequency operation.

EXAMPLES OF THE INVENTION

The following non-limiting examples and data illustrate various aspects and features relating to the compositions, devices and/or methods of the present invention, including the assembly of organic dielectric media comprising various inorganic moieties and/or layers, as are available through the synthetic methodologies described herein. In comparison with the prior art, the present compositions, methods and related device structures provide results and data which are surprising, unexpected and contrary thereto. While the utility of this invention is illustrated through the use of several compositions and devices comprising various molecular components, moieties and related structural configurations, it will be understood by those skilled in the art that comparable results are obtainable with various other compositions, devices and molecular components/moieties/structures as are commensurate with the scope of this invention.

Example 1

Materials. The Cl$_3$Si(CH$_2$)$_8$SiCl$_3$, octachlorotrisiloxane, and metal alkoxide reagents are commercially available, whereas the Stbz stilbazonium precursor was prepared according to the literature. Native oxide coated highly n-doped silicon (100) wafers were purchased from Montco Silicon Tech, Spring City, Pa. ITO-coated glass substrates (20 Ω/sq; 20-30-Å rms roughness) were purchased from Donnelly Corp and cleaned according to known procedures [P. Zhu et al., *Chem. Mater.* 14, 4982 (2002)]. Pentacene was purchased from Aldrich and purified by gradient vacuum sublimation before use. All self-assembly procedures were performed in an N$_2$-filled glove bag. Structures of reagents useful in such self-assembly process as shown in FIG. 2. Various other reagents and component precursors are found in the aforementioned references.

Example 2

Growth of SAS dielectrics. With reference to FIG. 1: Layer 1. Silicon or ITO substrates were loaded into a Teflon sample holder and immersed in a 5 mM toluene solution of Cl$_3$Si (CH$_2$)$_8$SiCl$_3$ at 0 C; after 1 h the substrates were rinsed twice with toluene and then sonicated in acetone-H$_2$O (95-5 v:v) solution for 3 min. The substrates were then dried at 115° C. for ~5 min. Layer 2. The substrates were immersed in a dry pentane solution of Si$_3$O$_2$Cl$_8$ (34 mM) for 30 min, washed twice with dry pentane, sonicated in acetone for 15 min, and dried at 115° C. for ~5 min. Layer 3. The substrates were immersed in a dry THF solution of Stbz chromophore precursor shown (1-2 mM) for ≧15 min at 60° C. After cooling to 25° C., the substrates were washed with toluene and THF, sonicated in acetone for 5 min., and dried at 115° C. for ~5 min. Layer 4. The substrates were immersed in a freshly prepared dry THF solution of metal alkoxide (M=Ti, Zr, Hf; 1.0 mM) for 1-2 h, washed twice with dry THF, washed twice with acetone in air, and then sonicated in acetone-H$_2$O (95-5 v:v) solution for 3 min, and in acetone for 2 min. The substrates can be dried at 115° C. for ~5 min in air. Additional such examples and synthetic techniques are found in the aforementioned references, in particular the co-pending '335 application.

Example 3

Device fabrication. For OTFTs, pentacene was vacuum deposited at ~2×10$^{-6}$ Torr (500 Å, 0.2 Å/s) while maintaining the substrate-nanodielectric temperature at 60° C. Gold electrodes for OTFT/MIS devices were vacuum-deposited through shadow masks at 3-4×10$^{-6}$ Torr (500-1000 Å, 0.5 Å/s).

Example 4

Electrical measurements. All OTFT measurements were carried out in air using a Keithly 6430 subfemtoammeter and a Keithly 2400 source meter, operated by a local Labview program and GPIB communication. Triaxial and/or coaxial shielding was incorporated into Signaton probe stations to minimize the noise level. A digital capacitance meter (Model 3000, GLK Instruments) and impedance/gain-phase analyzer (SI 1260, Solartron Analytical) were used for capacitance measurements.

What is claimed is:
1. A thin film transistor device comprising:
a substrate;
a dielectric material deposited on the substrate; and
a semiconductor material deposited on the dielectric material;
wherein the dielectric material comprises a multilayer composition, the multilayer composition comprising periodically alternating layers, the alternating layers comprising (a) one or more layers comprising a silyl or siloxane moiety, (b) one or more layers comprising a π-polarizable moiety, and (c) one or more layers com- prising an inorganic moiety comprising one or more main group metals and/or transition metals.

2. The device of claim 1, wherein at least some of the alternating layers of the dielectric material are coupled to an adjacent layer by a coupling layer comprising a siloxane matrix.

3. The device of claim 1, wherein the silyl moiety has the formula selected from —Si(CH2)$_n$Si—, —Si(CHF)$_n$Si—, and —Si(CF2)$_n$Si—, wherein n is 1, 2, 3, 4, 5, 6, 7, 8, 9 or 10.

4. The device of claim 1, wherein the π-polarizable moiety comprises a stilbazolium group.

5. The device of claim 1, wherein the one or more main group metals and/or transition metals are independently selected from In, Ga, Zr, Ti, Hf, and Ta.

6. The device of claim 1, wherein the dielectric material comprises self-assembled monolayers of the silyl moiety.

7. The device of claim 1, wherein the dielectric material comprises self-assembled monolayers of the π-polarizable moiety.

8. The device of claim 2, wherein at least some of the alternating layers of the dielectric material are coupled to one another or the siloxane matrix via a condensation reaction.

9. The device of claim 2, wherein at least some of the alternating layers of the dielectric material are coupled to one another or the siloxane matrix via chemisorption.

10. The device of claim 1, wherein both the substrate and the semiconductor material are transparent.

* * * * *